United States Patent [19]

Ito

[11] Patent Number: 5,019,481
[45] Date of Patent: May 28, 1991

[54] AQUEOUS BASE DEVELOPABLE NEGATIVE RESIST COMPOSITIONS

[75] Inventor: Hiroshi Ito, San Jose, Calif.

[73] Assignee: International Business Machines Corporation, Armonk, N.Y.

[21] Appl. No.: 411,960

[22] Filed: Sep. 25, 1989

[51] Int. Cl.$^5$ .............................. G03F 7/004
[52] U.S. Cl. .................... 430/270; 430/176; 430/330; 522/146; 522/19; 522/25; 522/28; 522/30; 522/31; 522/14; 522/134; 522/139
[58] Field of Search ............ 430/270, 176, 283, 330; 522/146, 19, 25, 28, 30, 31, 14, 134, 139

[56] References Cited

U.S. PATENT DOCUMENTS

| | | | |
|---|---|---|---|
| 3,787,302 | 1/1974 | Ijichi et al. | 522/146 X |
| 4,102,687 | 7/1978 | Crivello | 522/31 X |
| 4,640,937 | 2/1987 | Hanyuda | 522/31 |

FOREIGN PATENT DOCUMENTS

| | | | |
|---|---|---|---|
| 0232972 | 8/1987 | European Pat. Off. | 430/270 |
| 0285014 | 10/1988 | European Pat. Off. | 430/176 |
| 62-215946 | 9/1987 | Japan | 430/270 |

Primary Examiner—Cynthia Hamilton
Attorney, Agent, or Firm—Joseph G. Walsh

[57] ABSTRACT

An aqueous base developable negative resist composition comprising a phenolic resin, a radio-chemical acid generator and a small molecule which upon irradication and postbake reacts with the phenolic resin to decrease its rate of dissolution.

10 Claims, No Drawings

AQUEOUS BASE DEVELOPABLE NEGATIVE RESIST COMPOSITIONS

TECHNICAL FIELD

The present invention is concerned with negative resists which can be developed with aqueous bases. They have high dry etch resistance and high sensitivity and are non-swelling during development, thereby providing high resolution.

BACKGROUND ART

Most currently used cross-linking negative resist materials tend to suffer from limited resolution due to swelling during development. Others have a very narrow development latitude.

U.S. Pat. No. 4,544,621 shows polymers which are water soluble due to the incorporation of maleimide groups or quarternary ammonium groups into the polymer molecule.

DISCLOSURE OF THE INVENTION

According to the present invention, a negative resist composition is provided by mixing a phenolic resin, a radiochemical acid generator and a small molecule which, upon irradiation and postbake of the composition, reacts with the phenolic resin to reduce its dissolution rate in aqueous base.

The most preferred small molecules for use in the present invention are monomers and are aldehydes, amides or imides. The aldehydes should be relatively high boiling, for example a most preferred one is terephthaldehyde. The most preferred imides are N-hydroxymethylmaleimide, N-hydroxymethylsuccinimide, N-hydroxymethylglutarimide, and N-hydroxymethylphthalimide. N-acetoxymethyl derivatives are also useful. Preferred amides include N-hydroxymethyl-delta-valerolactam and N-acetoxymethyl-delta-valerolactam. In general, the small molecule is present in the resist composition at a level of about 3 to 20%, most preferably about 4 to 15%.

The most preferred phenolic resin for use in the present invention is poly(p-hydroxystyrene) but other phenolic resins such as novolac can be used. The resin should be transparent to the radiation being used. In general, the most preferred radiochemical acid generators are onium salts such as triarylsulfonium and diaryliodonium hexafluoroantimonates and trifluoromethanesulfonates. Other acid generators known in the literature can also be used. The radiochemical acid generator usually is present in the composition at a level of about 3 to 20%, preferably about 4 to 15%.

Any of many commercially available aqueous base developing solutions may be used with the compositions of the present invention. AZ2401 is an example of such a solution. No special solution is required.

It is believed that in use, the aldehydes in the compositions of the present invention undergo acidcatalyzed condensation upon postbake with the phenolic resin to form a novolac-type structure, thereby retarding the dissolution. The amides or imides of the compositions of the present invention undergo acid-catalyzed dehydration or elimination of acetic acid to generate carbonium ions, which attach onto the benzene rings or the hydroxylgroups of the phenolic resin, and thereby dramatically decrease the aqueous base dissolution rate. It should be noted that the primary imaging mechanism is based on the above mentioned reactions although cross-linking can be used as a secondary mechanism by incorporating bi- or trifunctional small molecules.

The compositions of the present invention are particularly suitable for use with ultra-violet light, but they are also useful with electron beams and X-ray. They may be used with longer wavelength radiation by means of sensitization or red-shifted sulfonium salts.

EXAMPLE 1

Lyncur PHM-C (transparent poly (p-hydroxystyrene) obtained from Maruzen Oil, OD=0.26/micron at 254 nm), N-hydroxymethylmaleimide (14.6 wt%), triphenylsulfonium hexafluoroantimonate (7.5 wt%) were dissolved in cyclohexanone. Spin-cast films had OD of 0.576/micron at 254 nm. The resist films were exposed through a quartz mask to 16mJ/cm$^2$ of 254 nm radiation, postbaked at 130C for 3 min, and developed in AZ2401/water=1/7 for 90 sec, providing high resolution negative images with full thickness retained in the exposed areas. Poly(p-hydroxystyrene) can also be prepared from poly(p-t-butoxycarbonyloxystyrene), poly(p-acetoxystyrene), poly(p-silyloxystyrene) and so on.

EXAMPLE 2

Lyncur PHM-C, terephthalaldehyde (5.0 wt%), and triphenylsulfonium hexafluoroantimonate (4.3 wt%) were dissolved in cyclohexanone. Spin-cast films had OD of 0.508/micron at 254 nm. High quality negative images were obtained by development in AZ2401/water=1/7 for 90 sec after exposure to 32 mJ/cm$^2$ of 254 nm radiation and postbake at 130C.

What is claimed is:

1. An aqueous base developable negative resist composition comprising a phenolic resin, a material which generates acid when exposed to radiation, and a small molecule selected from the group consisting of high boiling aldehydes, imides and amides which upon irradiation and postbake of the composition reacts with the phenolic resin to decrease its rate of dissolution.

2. A composition as claimed in claim 1 wherein the phenolic resin is poly (p-hydroxystyrene).

3. A composition as claimed in claim 1 wherein the phenolic resin is a novolac resin.

4. A composition as claimed in claim 1 wherein the small molecule is a high boiling aldehyde.

5. A composition as claimed in claim 4 wherein the aldehyde is terephthaldehyde.

6. A composition as claimed in claim 1 wherein the small molecule is an imide.

7. A composition as claimed in claim 1 wherein the small molecule is an amide.

8. A composition as claimed in claim 6 wherein the imide is N-hydroxymethylmaleimide.

9. A composition as claimed in claim 1 wherein the acid generator is an onium salt.

10. A composition as claimed in claim 9 wherein the onium salt is triphenylsulfonium hexafluoroantimonate.

* * * * *